United States Patent
Jansen et al.

(10) Patent No.: US 11,287,242 B2
(45) Date of Patent: Mar. 29, 2022

(54) CYCLIC ERROR MEASUREMENTS AND CALIBRATION PROCEDURES IN INTERFEROMETERS

(71) Applicant: ASML NETHERLANDS B.V., Veldhoven (NL)

(72) Inventors: Maarten Jozef Jansen, Casteren (NL); Engelbertus Antonius Fransiscus Van Der Pasch, Oirschot (NL); Suzanne Johanna Antonetta Geertruda Cosijns, Casteren (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/311,193

(22) PCT Filed: Jun. 29, 2017

(86) PCT No.: PCT/EP2017/066088
§ 371 (c)(1),
(2) Date: Dec. 19, 2018

(87) PCT Pub. No.: WO2018/010961
PCT Pub. Date: Jan. 18, 2018

(65) Prior Publication Data
US 2019/0265019 A1    Aug. 29, 2019

(30) Foreign Application Priority Data
Jul. 13, 2016    (EP) .................................... 16179189

(51) Int. Cl.
*G01B 9/02* (2006.01)
*G01B 9/02056* (2022.01)
(Continued)

(52) U.S. Cl.
CPC ..... *G01B 9/02059* (2013.01); *G01B 9/02003* (2013.01); *G01B 9/02007* (2013.01); *G01B 9/02072* (2013.04); *G03F 7/70775* (2013.01)

(58) Field of Classification Search
CPC ............ G01B 9/02059; G01B 9/02003; G01B 9/02072; G01B 9/02007; G03F 7/70775
See application file for complete search history.

(56) References Cited

U.S. PATENT DOCUMENTS

| 6,137,574 A * | 10/2000 | Hill ..................... G03F 7/70716 356/486 |
| 2002/0089671 A1 | 7/2002 | Hill |
| 2016/0054117 A1* | 2/2016 | Yamamoto ......... G01B 9/02059 356/489 |

FOREIGN PATENT DOCUMENTS

| JP | 2003324051 | 11/2003 |
| JP | 2006170796 | 6/2006 |

OTHER PUBLICATIONS

International Search Report and Written Opinion issued in corresponding PCT Patent Application No. PCT/EP2017/066088, dated Nov. 17, 2017.

(Continued)

*Primary Examiner* — Hwa Andrew Lee
(74) *Attorney, Agent, or Firm* — Pillsbury Winthrop Shaw Pittman LLP (57) ABSTRACT

An interferometer system, including a heterodyne interferometer and a processing system. The heterodyne interferometer is arranged to provide a reference signal and a measurement signal. The reference signal has a reference phase. The measurement signal has a measurement phase and an amplitude. The processing system is arranged to determine a cyclic error of the heterodyne interferometer based on the reference phase, the measurement phase and the amplitude.

20 Claims, 3 Drawing Sheets

(51) Int. Cl.
*G01B 9/02001* (2022.01)
*G03F 7/20* (2006.01)
*G01B 9/02055* (2022.01)
*G01B 9/02003* (2022.01)

(56) References Cited

OTHER PUBLICATIONS

Wu, Chien-ming, et al.: "Periodic nonlinearity resulting from ghost reflections in heterodyne interferometry", Optics Communications, Elsevier, vol. 215, No. 1-3, Jan. 1, 2003, pp. 17-23.
Wu, Chien-ming, et al.: "Nonlinearity in measurements of length by optical interferometry", Measurement Science and Technology, vol. 7, No. 1, Jan. 1, 1996, pp. 62-68.
Japanese Office Action issued in corresponding Japanese Patent Application No. 2019-501964, dated Mar. 3, 2020.
Japanese Office Action issued in corresponding Japanese Patent Application No. 2019-501964, dated Jun. 23, 2020.

* cited by examiner

CYCLIC ERROR MEASUREMENTS AND CALIBRATION PROCEDURES IN INTERFEROMETERS

CROSS-REFERENCE TO RELATED APPLICATIONS

This application is the U.S. national phase entry of PCT patent application no. PCT/EP2017/066088, which was filed on Jun. 29, 2017, which claims the benefit of priority of European patent application no. 16179189.2, which was filed on Jul. 13, 2016, and which is incorporated herein its entirety by reference.

BACKGROUND

Field of the Invention

The invention relates to an interferometer system, a further interferometer system, a method for calibration of an optical measurement system and a processing system.

Description of the Related Art

A lithographic apparatus is an apparatus that can be used in the manufacture of integrated circuits (ICs). In that instance, a patterning device, which is alternatively referred to as a mask or a reticle, may be used to generate a circuit pattern to be formed on an individual layer of the IC. This pattern can be transferred by a radiation beam via a projection system onto a target portion on a substrate, such as a silicon wafer. Transfer of the pattern is typically via imaging onto a layer of radiation-sensitive material provided on the substrate. In general, a single substrate will contain a network of adjacent target portions that are successively patterned. Known lithographic apparatus include so-called steppers, in which each target portion is irradiated by exposing an entire pattern onto the target portion at one time. Known lithographic apparatus also include so-called scanners, in which each target portion is irradiated by scanning the pattern through a radiation beam in a given direction while synchronously scanning the substrate parallel or anti parallel to this direction.

The lithographic apparatus typically is provided with an optical position measurement system, such as an interferometer system. The interferometer system is arranged to accurately determine the position of an object, such as table holding the substrate or an optical component of the projection system. The position of such an object needs to be accurately measured, so a control system can accurately move the object to a desired position. A measurement error of the interferometer causes the control system to move the object to a location at an offset of the desired position. Due to the offset, the pattern may not be projected properly on the substrate.

SUMMARY OF THE INVENTION

A disadvantage of the known interferometer system is that it suffers from so-called cyclic errors. The interferometer system provides a repetitive signal based on the position of the object. The cyclic errors are errors of the repetitive signal that depend on the phase of the signal.

To determine the cyclic errors, the following two known methods may be used. The first method requires the object to move with a specific speed over a specific range. The second method requires the object to vibrate with a certain frequency and a certain amplitude.

The first method has the disadvantage that the movement needs to be smooth and over a relatively large range. The movement may be disturbed by vibrations acting on the object and the movement range of the object may not be sufficiently long. The second method has the disadvantage the choice of the certain frequency is limited, due to the system dynamics of the object and due to sampling frequencies. It may be needed to choose a less than optimal frequency for vibrating the object.

It is an objection of the invention to provide an interferometer system with an improved accuracy.

In a first aspect of the invention, there is provided an interferometer system comprising an heterodyne interferometer; a processing system, wherein the heterodyne interferometer is arranged to provide a reference signal and a measurement signal, wherein the reference signal has a reference phase, wherein the measurement signal has a measurement phase and an amplitude, and wherein the processing system is arranged to determine a cyclic error of the heterodyne interferometer based on the reference phase, the measurement phase and the amplitude.

In a second aspect of the invention, there is provided an interferometer system comprising an interferometer, and a processing system, wherein the interferometer is arranged to provide a first distance signal representative of a distance to a target, wherein the interferometer is arranged to provide a second distance signal representative of the distance to the target, wherein the first distance signal is based on a radiation beam with a first wavelength, wherein the second distance signal is based on a radiation beam with a second wavelength, wherein the first wavelength is different from the second wavelength, and wherein the processing system is arranged to determine a difference between the distance as represented by the first distance signal and the distance as represented by the second distance signal.

In a third aspect of the invention, there is provided a method for calibration of an optical measurement system comprising measuring, along a measuring direction, a first position of a target; determining a first cyclic error of the optical measurement system while the target is at the first position; measuring, along the measuring direction, a second position of the target; determining a second cyclic error of the optical measurement system while the target is at the second position, wherein the second position is at a distance from the first position in a direction other than the measuring direction; storing a first corrective value based on the first cyclic error; and storing a second corrective value based on the second cyclic error.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
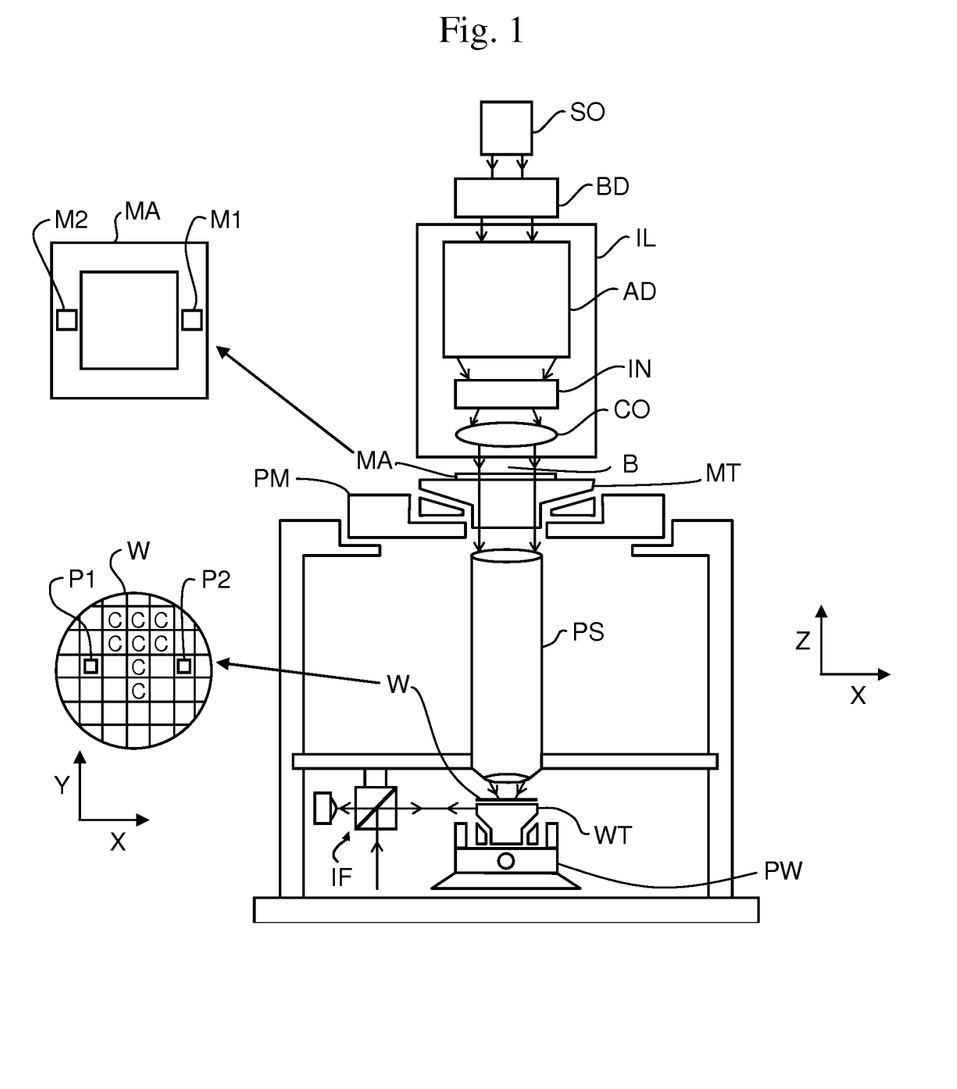
FIG. 1 depicts a lithographic apparatus according to the invention.

FIG. 1 schematically depicts a lithographic apparatus comprising an illumination system IL, a support structure MT, a substrate table WT and a projection system PS.

The illumination system IL is configured to condition a radiation beam B. The illumination system IL may include various types of optical components, such as refractive, reflective, magnetic, electromagnetic, electrostatic or other types of optical components, or any combination thereof, for directing, shaping, or controlling radiation.

The illumination system IL receives a radiation beam from a radiation source SO. The radiation source SO and the lithographic apparatus may be separate entities, for example when the radiation source SO is an excimer laser. In such cases, the radiation source SO is not considered to form part of the lithographic apparatus and the radiation beam B is passed from the radiation source SO to the illumination system IL with the aid of a beam delivery system BD comprising, for example, suitable directing mirrors and/or a beam expander. In other cases the source SO may be an integral part of the lithographic apparatus, for example when the radiation source SO is a mercury lamp. The radiation source SO and the illumination system IL, together with the beam delivery system BD if required, may be referred to as a radiation system.

The illumination system IL may comprise an adjuster AD for adjusting the angular intensity distribution of the radiation beam. In addition, the illumination system IL may comprise various other components, such as an integrator IN and a condenser CO. The illumination system IL may be used to condition the radiation beam B, to have a desired uniformity and intensity distribution in its cross section.

The term "radiation beam" used herein encompasses all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The support structure (e.g. a mask table) MT is for supporting a patterning device (e.g. a mask or reticle) MA. The support structure MT is connected to a first positioning system PM configured to accurately position the patterning device MA in accordance with certain parameters.

The support structure MT supports, i.e. bears the weight of the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" used herein should be broadly interpreted as referring to any device that can be used to impart a radiation beam B with a pattern in its cross-section such as to create a pattern in a target portion C of the substrate W. It should be noted that the pattern imparted to the radiation beam B may not exactly correspond to the desired pattern in the target portion C of the substrate W, for example if the pattern includes phase-shifting features or so called assist features. Generally, the pattern imparted to the radiation beam B will correspond to a particular functional layer in a device being created in the target portion C, such as an integrated circuit.

The patterning device MA may be transmissive or reflective. Examples of a patterning device MA include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix. As here depicted, the apparatus is of a transmissive type, which employs a transmissive mask.

The substrate table WT, e.g. a wafer table, is for holding a substrate W, e.g. a resist coated wafer. The substrate table WT is connected to a second positioning system PW configured to accurately position the substrate W in accordance with certain parameters. The projection system PS is configured to project a pattern imparted to the radiation beam B by patterning device MA onto a target portion C of the substrate W.

The term "projection system" used herein should be broadly interpreted as encompassing any type of projection system PS, including refractive, reflective, catadioptric, magnetic, electromagnetic and electrostatic optical systems, or any combination thereof, as appropriate for the exposure radiation being used, or for other factors such as the use of an immersion liquid or the use of a vacuum.

The radiation beam B is incident on the patterning device MA, which is held on the support structure MT, and is patterned by the patterning device MA. Having traversed the patterning device MA, the radiation beam B passes through the projection system PS which focuses the radiation beam B onto a target portion C of the substrate W. With the aid of the second positioning system PW and position sensor IF (e.g. an interferometric device, linear encoder or capacitive sensor), the substrate table WT can be moved accurately, e.g. so as to position different target portions C in the path of the radiation beam B. Similarly, the first positioning system PM and another position sensor (which is not depicted in FIG. 1) can be used to accurately position the patterning device MA with respect to the path of the radiation beam B. In general, movement of the support structure MT may be realized with the aid of a long-stroke module and a short-stroke module. The long-stroke module provides coarse positioning of the short-stroke module relative to the projection system PS over a long range. The short-stroke module provides fine positioning of the patterning device MA relative to the long-stroke module over a small range. Similarly, movement of the substrate table WT may be realized using a long-stroke module and a short-stroke module, which form part of the second positioning system PW. In the case of a stepper (as opposed to a scanner) the support structure MT may be connected to a short-stroke actuator only, or may be fixed.

Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. Similarly, in situations in which more than one die is provided on the patterning device MA, the mask alignment marks M1, M2 may be located between the dies.

The lithographic apparatus may be of a type having two or more substrate tables WT and/or two or support structures MT. In addition to the at least one substrate table WT, the lithographic apparatus may comprise a measurement table, which is arranged to perform measurements but is not arranged to hold a substrate.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

The depicted lithographic apparatus could be used in at least one of the following three modes: In the first mode, the so-called step mode, the support structure MT and the substrate table WT are kept essentially stationary, while an entire pattern imparted to the radiation beam is projected onto a target portion C at one time. The substrate table WT is then shifted in the X and/or Y direction so that a different target portion C can be exposed. In the second mode, the so-called scan mode, the patterning device MT and the substrate table WT are scanned synchronously while a pattern imparted to the radiation beam is projected onto a target portion C. The velocity and direction of the substrate table WT relative to the patterning device MT may be determined by the (de-)magnification and image reversal characteristics of the projection system PS. In the third mode, the patterning device MA is kept essentially stationary holding a programmable patterning device MA, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device MA, such as a programmable mirror array of a type as referred to above.

Combinations and/or variations on the above described modes of use or entirely different modes of use may also be employed.

Figure 2:
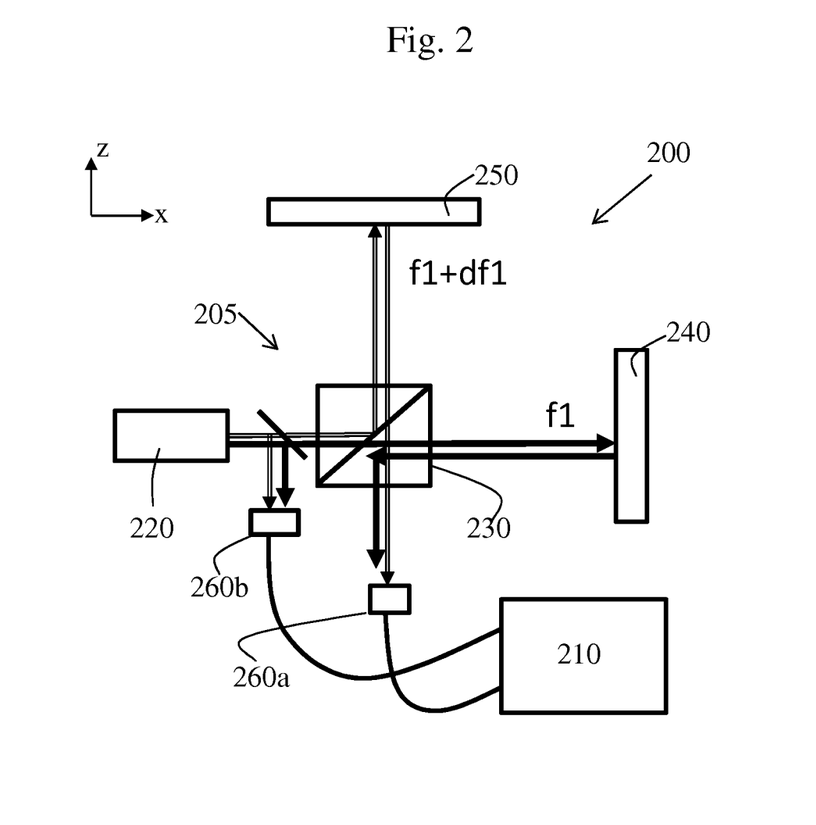
FIG. 2 depicts an interferometer system according to the invention.

FIG. 2 depicts an interferometer system 200 according to an embodiment of the invention. The interferometer system 200 comprises an interferometer 205 and a processing system 210. The interferometer 205 comprises a laser source 220, a beamsplitter 230, a target 240, a reference 250 and detector units 260a, 260b. The interferometer 205 is a heterodyne interferometer. The laser source 220 is a heterodyne laser source and provides a radiation beam that has two combined wavelengths. One of the wavelengths has a frequency f1. The other wavelength has a frequency of f1+df1. Part of the radiation beam is directed to detector unit 260b. A remaining part of the radiation beam is directed to a beamsplitter 230. The radiation beam is split by the beamsplitter 230. A first part of the radiation beam propagates to the target 240 and is reflected back to the beamsplitter 230. A second part of the radiation beam propagates to the reference 250 and is reflected back to the beam splitter 230.

The radiation beam is further propagated to the detector unit 260a. The radiation beam incident on the detector unit 260a represents a position of the target 240. The detector unit 260a is a measurement detector that is arranged to provide a measurement signal to the processing system 210. The detector 260b is a reference detector that is arranged to provide a reference signal to the processing system 210. A movement of the target 240 causes a change in frequency in the radiation beam incident on detector unit 260a. The processing system 210 is arranged to derive a position of the target 240 based on the change of the frequency in the radiation beam incident on detector unit 260a.

Figure 3:
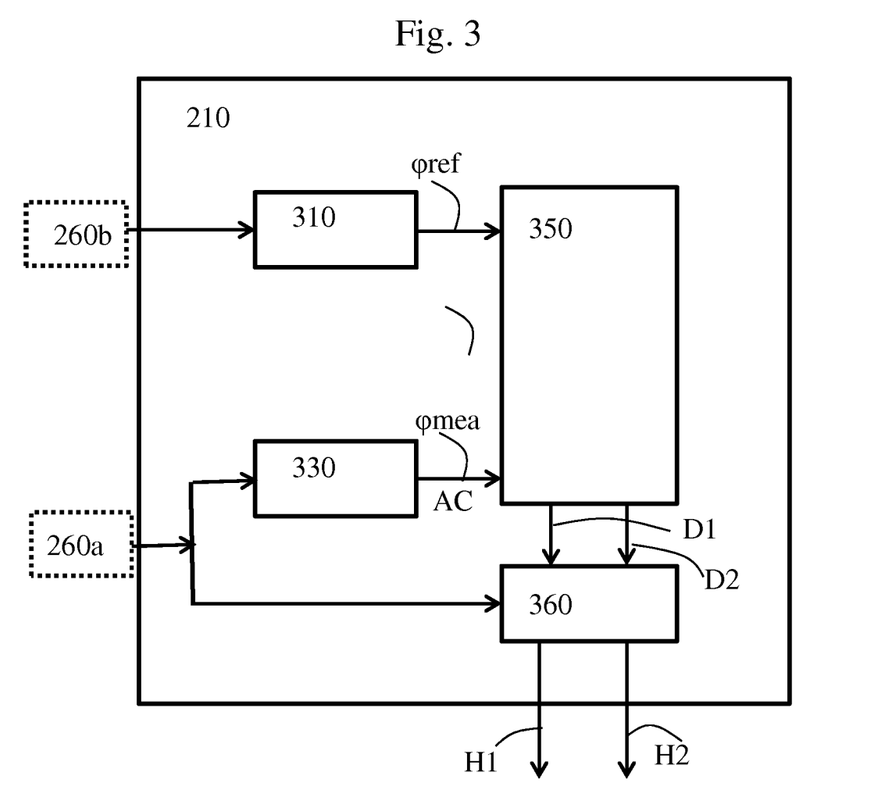
FIG. 3 depicts a processing system of an interferometer system according to an embodiment of the invention.

FIG. 3 provides a detailed schematic view of the processing system 210. The processing system 210 comprises an input to receive the measurement signal and the reference signal from resp. detector units 260a, 260b. The processing system 210 comprises a phase calculator 310 to calculate a reference phase φref of the reference signal. The reference signal may be a sine-shaped signal. The phase calculator 310 may determine the phase or a change in phase of the sine-shape over time.

In an embodiment, the interferometer system 200 does not have detector unit 260b. Instead, the processing system 210 may use the control signal of an AOM (Acoustic Optical Modulator) that generates the radiation beam to determine the reference phase φref. Alternatively, another control signal for controlling the laser source 220 is used to determine the reference phase φref. The detector unit 260b may be used to detect changes in the frequency of the radiation beam caused by an optical fiber propagating the radiation beam from the laser source 220 to the interferometer 205.

The processing system 210 comprises a phase calculator 330 arranged to calculate a measurement phase φmea of the measurement signal. The measurement signal may be substantially sine-shaped. The phase calculator 330 may determine the phase or a change in phase of the sine-shape over time.

The processing system 210 is arranged to generate two homodyne signals H1, H2, based on the reference phase φref and the measurement phase φmea. So even though the interferometer system 200 uses a heterodyne interferometer 205, the processing system 210 outputs two homodyne signals H1, H2. The cyclic errors of the interferometer system 200 may be determined and corrected using known compensation methods for homodyne interferometers, such as a Heydemann correction. There are known compensation methods for homodyne interferometers that require only a small movement of the target 240 or do not have speed requirements.

The processing system 210 may comprise a frequency generator arranged to determine a measurement frequency of the measurement signal. The measurement frequency may be dependent on the frequency of the radiation beam as provided by the laser source 220. When the target 240 is stationary, the measurement frequency is typically equal to the split frequency determined by frequencies f1 and df1. The split frequency may be several MHz, for example between 1-20 MHz, for example 10, 12 or 15 MHz. In addition, when the target 240 moves, the Doppler effect causes the measurement frequency to change with a so-called Doppler shift. The processing system 210 may use the measurement frequency to generate the two homodyne signals H1, H2. By using the measurement frequency to generate the two homodyne signals H1, H2, the two homodyne signals H1, H2 can be made independent of a speed of the target 240.

The measurement frequency may be generated by the frequency generator. The frequency generator uses the measurement signal from the detector unit 260a as an input. Alternatively or in addition, speed information about the target 240 may be used to determine the measurement frequency. In an embodiment, the frequency generator does not use the measurement signal as an input, but uses other information as an input, for example speed information of the target 240, or for example, by using information about the Doppler shift.

The processing system 210 may comprise a demodulator 350 to generate a demodulation signal D1. The demodulation signal D1 is based on the reference phase φref and the measurement phase φmea. The demodulator 350 may be arranged to generate a further demodulation signal D2 that is out of phase with the demodulation signal D1. For example, the further demodulation signal D2 is out of phase with the demodulation signal D1 with −120°, −90°, +90° or +120°. The demodulator 350 may be arranged to generate additional demodulation signals that are out of phase with the demodulation signal D1 and the further demodulation signal D2. For example, the demodulator 350 may generate three demodulation signals, each at a 120° phase difference relative to each other. The demodulator 350 may make use of a window, such as a Hanning-window, to create the demodulation signal D1.

The processing system 210 may comprise a calculator 360 to calculate the homodyne signal H1 by multiplying the measurement signal with the demodulation signal D1 and to calculate the homodyne signal H2 by multiplying the measurement signal with the further demodulation signal D2. Because the demodulation signal D1 and the further demodulation signal D2 are out of phase with each other, the two homodyne signals H1, H2 are also out of phase with each other. For example, the two homodyne signals H1, H2 are 90° out of phase with each other. Because the two homodyne signals H1, H2 are out of phase, a Lissajous curve can be determined. Ideally, the Lissajous curve is a perfect circle. However, due to cyclic errors, the Lissajous curve has an elliptical shape. The elliptical shape is an indication of the cyclic errors of the interferometer system 200.

In an embodiment, instead of using a heterodyne interferometer, a heterodyne encoder system can be used with the processing system 210.

In an embodiment, the processing system 210 is arranged to determine a cyclic error of the heterodyne interferometer 205 based on the reference phase φref and the measurement frequency. To determine the cyclic error, the processing system 210 may use information about the amplitude of the measurement signal.

In an embodiment, the demodulator 350 is not used. In such embodiment interferometer system 200 comprises the interferometer 205 and a processing system 210. The interferometer 205 may a heterodyne interferometer. The interferometer 205 is arranged to provide a reference signal and a measurement signal. The reference signal has the reference phase φref. The measurement signal has the measurement phase φmea and the amplitude AC. The processing system 210 is arranged to determine a cyclic error of the heterodyne interferometer 205 based on the reference phase φref, the measurement phase φmea and the amplitude AC.

In such embodiment, the processing system 210 is arranged to determine from the measurement signal the amplitude AC, also known as AC-value, and the measurement phase φmea. In FIG. 3, the phase generator 330 is arranged to provide a signal representative of the amplitude AC. In an embodiment, the processing system 210 has another unit than the phase generator 330 to provide the signal representative of the amplitude AC. The processing system 210 may use information about the speed of the target 240, for example the measurement frequency, to determine for which frequency the amplitude AC and measurement phase φmea are to be determined. The processing system 210 may be arranged to determine a Lissajous curve based on the reference phase φref, the measurement phase φmea and the amplitude AC by using the following equations:

$$S_0 = AC \cdot \cos(\varphi_{mea} - \varphi_{ref})$$

$$S_{90} = AC \cdot \sin(\varphi_{mea} - \varphi_{ref})$$

Wherein AC is the amplitude, φmea is the measurement phase and φref is the reference phase. Ideally, S0 and S90 describe a perfect circle in the Lissajous curve. Cyclic errors cause the Lissajous curve to be an ellipse. The cyclic errors can be corrected by correcting the amplitude AC, or by correcting the measurement phase φmea or by correcting the difference between the measurement phase φmea and the reference phase φref. For example, a Heydemann correction can be used. After correction, the Lissajous curve may be a circle instead of an ellipse.

The processing system 210 may be arranged to generate the two homodyne signals H1 and H2 based on the reference phase φref, the measurement phase φmea and the amplitude AC. The processing system 210 is arranged to determine the cyclic error based on the two homodyne signals H1, H2.

The interferometer system 200 may be arranged to provide a first distance signal and a second distance signal. Each of the first distance signal and the second distance signal is representative of the distance of the target 240. The first distance signal is based on a radiation beam with a first wavelength. The second distance signal is based on a radiation beam with a second wavelength. The interferometer 205 of FIG. 2 shows only a radiation beam with a first wavelength, which has frequencies f1 and df1. To create the second distance signal, the interferometer 205 may use a further radiation beam having frequencies f2 and df2. Frequencies f1 and f2 may be in the order of THz and may be several THz apart. Frequencies df1 and df2 may be in the order or MHz and may be several MHz apart. For example df1 and df2 are resp. 12 Mhz and 15 Mhz.

The first wavelength and the second wavelength are different from each other. The radiation beam with the first wavelength and the further radiation beam with the second wavelength may substantially travel along the same optical path. The processing system 210 may be arranged to determine a difference between the distance as represented by the first distance signal and the distance as represented by the second distance signal.

Ideally, when the first distance signal and the second distance signal perfectly represent the distance, there is no difference. However, due cyclic errors of the interferometer system 200, there is typically a difference. The processing system 210 may be arranged to determine the cyclic errors based on the difference. The processing system 210 may further be arranged to correct at least one of the first distance signal and the second distance signal based on the difference.

The processing system 210 may be arranged to collect, during a period of time, a set of first samples of the first distance signal and a set of second samples of the second distance signal. The processing system 210 may determine the difference based on the set of first samples and the set of second samples signal. The processing system 210 may be arranged to generate a synthetic wavelength based on a combination of the first distance signal and the second distance signal. The set of first samples and the set of second samples represent a change in distance. The change in distance may have a length of at least the synthetic wavelength. The accuracy with which the cyclic errors are determined improves if the change in distance is a substantial part of the synthetic wavelength, for example 0.3×, or 0.5×, or 0.7× of 1× or 2× the synthetic wavelength.

The set of first samples and the set of second samples represent a movement of the target 240 from a first position to a second position. When selecting the distance between the first position and the second position to be at least the length of the synthetic wavelength, the cyclic errors can be determined more accurately.

Based on the range of movement, the synthetic wavelength may be selected. For example, the range of movement has the same length or a larger length than the synthetic wavelength. The synthetic wavelength may be selected by selecting suitable values for the first wavelength and the second wavelength. The synthetic wavelength depends on the difference between the first wavelength and the second wavelength. By choosing a small difference, the synthetic wavelength becomes large. By choosing a large difference, the synthetic wavelength becomes small.

The cyclic errors may be determined by using the following equation $$(L1-L2) = \text{cyclic\_error}1(\text{ph}1) - \text{cyclic\_error}2(\text{ph}2) \ldots + \text{offset}$$

L1 represents the distance as represented by the first distance signal. L2 represents the distance as represented by the second distance signal. L1 and L2 may be determined by using a beam length of the radiation beam and the further radiation beam, or by using the unwrapped phase information of the radiation beam and the further radiation beam. Cyclic_error1(ph1) represents the cyclic error of the radiation beam at a certain phase. Cyclic_error2(ph2) represents the cyclic error of the further radiation beam at a certain further phase. By solving the equation for L1-L2 at a plurality of positions of the target 240, the cyclic errors can be determined. The plurality of positions may be 5 or more positions to improve accuracy. The equation for L1-L2 may be expanded to include amplitudes and phases of higher harmonics, such as the $1^{st}$ harmonic, the $2^{nd}$ harmonic etc.

In the embodiments above, the interferometer system 200 is described as an optical measurement system to determine the position of the target 210 along a measuring direction. However, the target 240 may be connected to an object that is able to move in more degrees of freedom than one. An example is given in FIG. 4.

Figure 4:
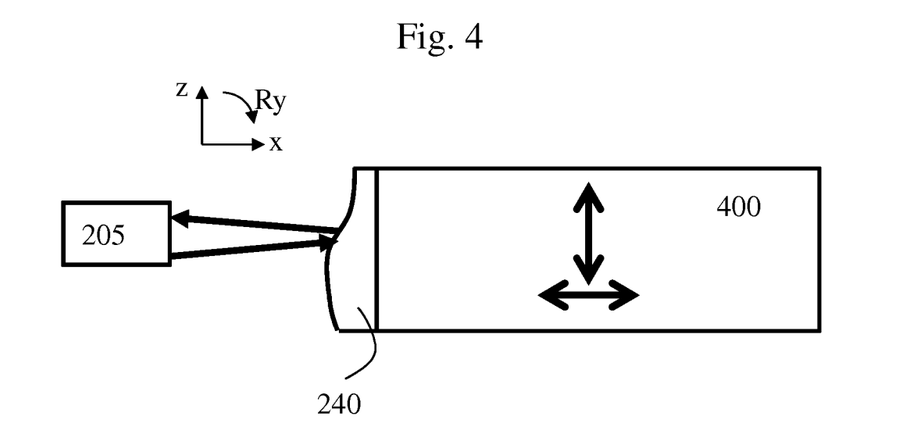
FIG. 4 depicts part of an interferometer system according to a further embodiment of the invention.

FIG. 4 shows only part of the interferometer system 200. The interferometer 205 propagates part of the radiation beam onto the target 240. The target 240 is connected to the object 400. The measuring direction of the interferometer 205 is along the x-axis. However, the object 400 is able to move along both the x-axis and the z-axis. Due to, for example, imperfections of the surface of the target 240, the radiation beam may be reflected back to the interferometer 205 differently dependent on the z-position of the object 400. For example, the intensity or the angle of the radiation beam may differ. Differences in the radiation beam cause the cyclic errors of the interferometer system 200 to be different as well. So the cyclic errors may be dependent on the z-position of the target 240.

To correct for the z-dependent cyclic errors, the interferometer system 200 may be arranged to perform the following method. First, a first position of the target 240 is measured along the measuring direction. While the target 240 is at the first position, a first cyclic error is determined, for example as described in the embodiments above or by using known ways to determine cyclic errors. Then, the target 240 is moved to a second position. The second position is at a distance from the first position in a direction other than the measuring direction. In the example of FIG. 4, the second position is at a different z-position than the first position. In addition, the second position may be at a different x-position than the first position. The position of the target 240 is measured at the second position. While the target 240 is at the second position, a second cyclic error is determined, for example as described in the embodiments above or by using known ways to determine cyclic errors. A first corrective value based on the first cyclic error is stored. A second corrective value based on the second cyclic error is stored.

After storing the first and second corrective values, the interferometer system 200 may be used to accurately measure the position of the object 400. When the object 400 is moved such that the target is at or near the first position, the measurement value of the interferometer system 200 is corrected with the first corrective value. When the object 400 is moved such that the target 240 is at or near the second position, the measurement value of the interferometer system 200 is corrected with the second corrective value.

In a position between the first position and the second position, part of the first corrective value and part of the second corrective value may be used. A model may be used to determine the corrective values away from the first and second positions, for example by interpolation.

The method above may be performed for multiple z-positions to determine cyclic errors at more than 2 z-positions of the target 240. Instead or in addition, the object 400 may be moved in the y-direction. At different y-directions, the cyclic errors may be determined and corresponding corrective values may be stored.

In addition or alternatively, the first cyclic error is determined while the target 240 is at the first position at a first angular orientation. A further first cyclic error is determined while the target 240 is at the first position at a second angular orientation. The second angular orientation is different from the first angular orientation. A further first corrective value based on the further cyclic error is stored.

After storing the first and further first corrective values, the interferometer system 200 may be used to accurately measure the angular orientation of the object 400. When the object 400 is moved such that the target 240 is at or near the first position and is at the first angular orientation, the measurement value of the interferometer system 200 is corrected with the first corrective value. When the object 400 is moved such that the target 240 is at or near the first position and at the second angular orientation, the measurement value of the interferometer system 200 is corrected with the further first corrective value.

Changes in angular orientation of the target 240 may, for example, cause a change in the angle at which the radiation beam is reflected. The change in angle may change the cyclic error. So by storing the further first corrective value, the cyclic error may be corrected for different angular orientations of the target 240.

In an embodiment, the object 400 is movable in 6 degrees of freedom. Corrective values may be stored for a combination of x-, y- and z-positions and Rx-, Ry and Rz-rotations. A lookup-table may be used to store the corrective values. A model may be used to predict a corrective value for all possible positions and rotations, based on a limited number of stored corrective values.

Instead of an interferometer, any other optical measurement system may be arranged to perform the method described above. For example, the optical measurement system is an encoder system, for example a heterodyne encoder or a homodyne encoder. The method may be applied to a homodyne interferometer or a heterodyne interferometer.

In an embodiment, the target 240 is connected to one of the substrate table WT or the support structure MT. The target 240 may be connected to an optical component of the projection system PS. The optical component may comprise a mirror or a lens. The optical component may be arranged to follow a desired trajectory while a target portion C is being exposed.

The processing system 210 may be implemented differently than described. For example, parts of processing system 210 may be implemented as a single unit or may be split over several units. The processing system 210 may be a completely digital processing system 210 or may be a combination of a digital and analogue processing system 210. Detector units 260a, 260b may be part of the processing system 210.

In an embodiment, there is provided an interferometer system, comprising a heterodyne interferometer and a processing system, wherein the heterodyne interferometer is arranged to provide a reference signal and a measurement signal, wherein the reference signal has a reference phase, wherein the measurement signal has a measurement phase and an amplitude, and wherein the processing system is arranged to determine a cyclic error of the heterodyne interferometer based on the reference phase, the measurement phase and the amplitude.

In an embodiment, the processing system is arranged to generate two homodyne signals based on the reference phase, the measurement phase and the amplitude, wherein the processing system is arranged to determine the cyclic error based on the two homodyne signals. In an embodiment, the processing system is arranged to generate based on the reference phase a demodulation signal and a further demodulation signal, wherein the further demodulation signal is out of phase with the demodulation signal, wherein the processing system is arranged to generate one of the two homodyne signals based on the demodulation signal and to generate the other of the two homodyne signals based on the further demodulation signal. In an embodiment, the processing system is arranged to generate the one of the two homodyne signals by multiplying the measurement signal with the demodulation signal and to generate the other of the two homodyne signals by multiplying the measurement signal with the further demodulation signal. In an embodiment, the processing system is arranged to collect, during a period of time, a set of measurement samples of the measurement signal and a set of reference samples of the reference signal, wherein the processing system is arranged determine the cyclic error based on the set of measurement samples and the set of reference samples.

In an embodiment, there is provided an interferometer system, comprising an interferometer, and a processing system, wherein the interferometer is arranged to provide a first distance signal representative of a distance to a target, wherein the interferometer is arranged to provide a second distance signal representative of the distance to the target, wherein the first distance signal is based on a radiation beam with a first wavelength, wherein the second distance signal is based on a radiation beam with a second wavelength, wherein the first wavelength is different from the second wavelength, and wherein the processing system is arranged to determine a difference between the distance as represented by the first distance signal and the distance as represented by the second distance signal.

In an embodiment, the processing system is arranged to determine a cyclic error of the interferometer based on the difference. In an embodiment, the processing system is arranged to correct at least one of first distance signal and the second distance signal based on the difference. In an embodiment, the processing system is arranged to collect, during a period of time, a set of first samples of first distance signal and a set of second samples of the second distance signal, wherein the processing system is arranged to determine the difference based on the set of first samples and the set of second samples. In an embodiment, the processing system is arranged to generate a synthetic wavelength based on a combination of the first distance signal and the second distance signal, wherein the set of first samples and the set of second samples represent a change in distance, wherein the change in distance has a length of at least the synthetic wavelength.

In an embodiment, there is provided a method for calibration of an optical measurement system, comprising measuring, along a measuring direction, a first position of a target; determining a first cyclic error of the optical measurement system while the target is at the first position; measuring, along the measuring direction, a second position of the target; determining a second cyclic error of the optical measurement system while the target is at the second position, wherein the second position is at a distance from the first position in a direction other than the measuring direction; storing a first corrective value based on the first cyclic error; and storing a second corrective value based on the second cyclic error.

In an embodiment, the method comprises correcting a measurement value of the optical measurement system with the first corrective value when the target is at or near the first position, and correcting a further measurement value of the optical measurement system with the second corrective value when the target is at or near the second position. In an embodiment, the method comprises determining the first cyclic error of the optical measurement system while the target is at the first position and while the target is in a first angular orientation; determining a further first cyclic error of the optical measurement system while the target is at the first position and while the target is in a second angular orientation different from the second angular orientation; storing a further first corrective value based on the further first cyclic error; correcting a measurement value of the optical measurement system with the first corrective value when the target is at or near the first position and has the first angular orientation; and correcting a measurement value of the optical measurement system with the further first corrective value when the target is at or near the first position and has the second angular orientation.

In an embodiment, there is provided a processing system for use in the interferometer system as described herein. In an embodiment, there is provided a processing system arranged to perform a method as described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate W and develops the exposed resist), a metrology tool and/or an inspection tool. Further, the substrate W may be processed more than once, for example in order to create a multi-layer IC, so that the term substrate W used herein may also refer to a substrate W that already contains multiple processed layers.

While specific embodiments of the invention have been described above, it will be appreciated that the invention may be practiced otherwise than as described.

The descriptions above are intended to be illustrative, not limiting. Thus, it will be apparent to one skilled in the art that modifications may be made to the invention as described without departing from the scope of the claims set out below.

The invention claimed is:

1. A method for calibration of an optical measurement system involving radiation interference, the method comprising:
   measuring an optical characteristic for a target, along a measuring direction, at a first position or first angular orientation of the target;
   determining, based on the measurement for target at the first position or in the first angular orientation, a first cyclic error of the optical measurement system for when the target is at the first position or in the first angular orientation;
   measuring an optical characteristic for the target, along the measuring direction, at a second position or second angular orientation of the target;
   determining, based on the measurement for the target at the second position or in the second angular orientation, a second cyclic error of the optical measurement system for when the target is at the second position or in the second angular orientation, wherein the second position or angular orientation is at a displacement distance from the first position or angular orientation in a direction other than the measuring direction;
   after determination of the first and second cyclic errors, correcting, based on the first cyclic error but not the second cyclic error, measurements by the optical measurement system when the optical measurement system later measures at or near the first position or angular orientation; and
   after determination of the first and second cyclic errors, correcting, based on the second cyclic error but not the first cyclic error, measurements by the optical measurement system when the optical measurement system later measures at or near the second position or angular orientation.

2. The method of claim 1, comprising:
   correcting a measurement value of the optical measurement system with a first corrective value for when the target is at or near the first position, and
   correcting a further measurement value of the optical measurement system with a second corrective value for when the target is at or near the second position.

3. The method of claim 2, comprising correcting a measurement value of the optical measurement system with a part of the first corrective value and a part of the second corrective value for when the target is between the first position and the second position.

4. The method of claim 1, comprising correcting a measurement value of the optical measurement system with a first corrective value for when the target is at the first angular orientation.

5. The method of claim 1, comprising correcting a measurement value of the optical measurement system with a second corrective value for when the target is at the second angular orientation.

6. The method of claim 1, comprising storing corrective values for a combination of x-, y-, and z-positions and Rx-, Ry- and Rz-rotations of the target.

7. The method of claim 6, comprising storing the corrective values in a lookup-table.

8. An optical measurement system involving radiation interference, comprising:
   an optical measurement apparatus; and
   a processing system configured to cause at least:
      measurement of an optical characteristic for a target, by the measurement apparatus along a measuring direction, at a first position or first angular orientation of the target;
      determination, based on the measurement for the target at the first position or in the first angular orientation, of a first cyclic error of the optical measurement system for when the target is at the first position or in the first angular orientation;
      measurement of an optical characteristic for the target, by the measurement apparatus along the measuring direction, at a second position or second angular orientation of the target;
      determination, based on the measurement for the target at the second position or in the second angular orientation, of a second cyclic error of the optical measurement system for when the target is at the second position or in the second angular orientation, wherein the second position is at a displacement distance from the first position in a direction other than the measuring direction;
      after determination of the first and second cyclic errors, correction, based on the first cyclic error but not the second cyclic error, measurements by the optical measurement system when the optical measurement system later measures at or near the first position or angular orientation; and
      after determination of the first and second cyclic errors, correction, based on the second cyclic error but not the first cyclic error, measurements by the optical measurement system when the optical measurement system later measures at or near the second position or angular orientation.

9. The optical measurement system of claim 8, wherein the measurement apparatus comprises a non-encoder interferometer.

10. The optical measurement system of claim 9, wherein the interferometer is a heterodyne interferometer arranged to provide a reference signal having a reference phase and provide a measurement signal having a measurement phase and an amplitude, and wherein the processing system is arranged to determine the first cyclic error and the second cyclic error based on the reference and measurement signals.

11. The optical measurement system of claim 9, wherein:
   optics of the interferometer are arranged to provide a first distance signal representative of a distance to the target,
   the optics of the interferometer are arranged to provide a second distance signal representative of the distance to the target, the first distance signal is obtained using a radiation beam with a first wavelength, the second distance signal is obtained using a radiation beam with a second wavelength different from the first wavelength, and wherein the processing system is arranged to determine a difference between the distance as represented by the first distance signal and the distance as represented by the second distance signal, and arranged to determine the first cyclic error and the second cyclic error based on the difference.

12. The optical measurement system of claim 8, wherein the measurement apparatus comprises an encoder system.

13. A lithographic apparatus comprising:
a patterning system configured to transfer a pattern to a substrate; and
the optical measurement system of claim 8.

14. The lithographic apparatus of claim 13, wherein the patterning system comprises a projection system arranged to project a pattern on the substrate and a substrate table arranged to hold the substrate, wherein the target is connected to the substrate table or to an optical component of the projection system.

15. A non-transitory computer-readable medium comprising instructions therein, the instructions, when executed by a computer system, are configured to cause the computer system to at least:
obtain a measurement of an optical characteristic for a target, by an optical measurement system along a measuring direction, at a first position or first angular orientation of the target, the optical measurement system involving radiation interference;
determine, based on the measurement at the first position or in the first angular orientation, a first cyclic error of the optical measurement system for when the target is at the first position or in the first angular orientation;
obtain a measurement of an optical characteristic for the target, by the optical measurement system along the measuring direction, at a second position or second angular orientation of the target;
determine, based on the measurement at the second position or in the second angular orientation, a second cyclic error of the optical measurement system for when the target is at the second position or in the second angular orientation, wherein the second position or angular orientation is at a displacement distance from the first position or angular orientation in a direction other than the measuring direction;

after determination of the first and second cyclic errors, correct, based on the first cyclic error but not the second cyclic error, measurements by the optical measurement system when the optical measurement system later measures at or near the first position or angular orientation; and after determination of the first and second cyclic errors, correct, based on the second cyclic error but not the first cyclic error, measurements by the optical measurement system when the optical measurement system later measures at or near the second position or angular orientation.

16. The computer-readable medium of claim 15, wherein the instructions are further configured to cause the computer system to:
correct a measurement value of the optical measurement system with a first corrective value for when the target is at or near the first position, and
correct a further measurement value of the optical measurement system with a second corrective value for when the target is at or near the second position.

17. The computer-readable medium of claim 16, wherein the instructions are further configured to cause the computer system to correct a measurement value of the optical measurement system with a part of the first corrective value and a part of the second corrective value for when the target is between the first position and the second position.

18. The computer-readable medium of claim 15, wherein the instructions are further configured to cause the computer system to correct a measurement value of the optical measurement system with a first corrective value for when the target is at the first angular orientation.

19. The computer-readable medium of claim 15, wherein the instructions are further configured to cause the computer system to correct a measurement value of the optical measurement system with a second corrective value for when the target is at the second angular orientation.

20. The computer-readable medium of claim 15, wherein the optical measurement system comprises an interferometer arranged to provide a reference signal having a reference phase and provide a measurement signal having a measurement phase and an amplitude, and wherein the instructions are further configured to cause the computer system to determine the first cyclic error and the second cyclic error based on the reference and measurement signals.

* * * * *